United States Patent
Kwak et al.

(10) Patent No.: US 7,227,312 B2
(45) Date of Patent: Jun. 5, 2007

(54) ORGANIC ELECTROLUMINESCENT DISPLAY DEVICE

(75) Inventors: Won-Kyu Kwak, Seongnam-si (KR); Sung-Chon Park, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 126 days.

(21) Appl. No.: 11/028,299

(22) Filed: Jan. 4, 2005

(65) Prior Publication Data
US 2005/0162081 A1    Jul. 28, 2005

(30) Foreign Application Priority Data
Jan. 5, 2004    (KR) .................. 10-2004-0000431

(51) Int. Cl.
G09G 3/10    (2006.01)
(52) U.S. Cl. ............... 315/169.3; 313/505; 345/76
(58) Field of Classification Search ............ 315/169.1, 315/169.3; 313/505, 506, 504, 495; 345/76, 345/92; 257/59
See application file for complete search history.

(56) References Cited

U.S. PATENT DOCUMENTS

| | | | |
|---|---|---|---|
| 2002/0190971 A1* | 12/2002 | Nakamura et al. | 345/204 |
| 2005/0093802 A1* | 5/2005 | Yamazaki et al. | 345/92 |

* cited by examiner

Primary Examiner—Tuyet Vo
Assistant Examiner—Jimmy Vu
(74) Attorney, Agent, or Firm—H.C. Park & Associates, PLC

(57) ABSTRACT

An organic electroluminescent display device can compensate for voltage drop of power supply voltage line by asymmetrically arranging a plurality of contact hole for connecting cathode electrodes and cathode power supply line. The organic electroluminescent display device may include first power supply line for supplying power supply voltage to pixels, and second power supply line for supplying voltage to an electrode on the upper side of the pixel (the supply line can include a region superposed on the electrode). The second power supply line may include a plurality of contact holes through which the second power supply line is connected to the electrode. The plurality of contact holes may be asymmetrically arranged with respect to a bisector of the superposition region of the second power supply line and electrode.

37 Claims, 14 Drawing Sheets

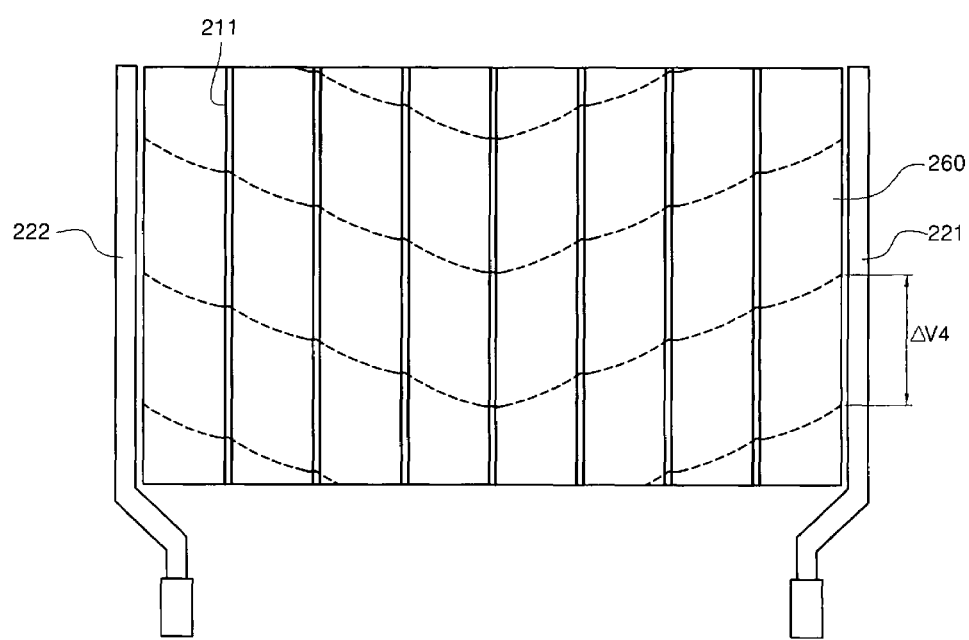

ORGANIC ELECTROLUMINESCENT DISPLAY DEVICE

CROSS REFERENCE

This application claims the benefit of Korean Patent Application No. 2004-431, filed on Jan. 5, 2004, the disclosure of which is hereby incorporated herein by reference in its entirety.

BACKGROUND OF THE INVENTION

1. Field of the invention

The present invention relates to an organic electroluminescent display device, more particularly, to an organic electroluminescent display device capable of compensating voltage drop of power supply voltage lines by asymmetrically forming a plurality of contact holes for connecting a cathode electrode and a cathode power supply line.

2. Description of Related Art

FIG. 1 is a plane figure for showing a conventional organic electroluminescent display device.

As shown in FIG. 1, an organic electroluminescent display device 100 may include a pixel region 160 equipped with a plurality of pixels and an upper power supply voltage line 110 arranged at an upper side and left and right sides of the pixel region 160 for power supply voltage. It may also include a lower power supply voltage line 130 arranged at a lower side of the pixel region 160 for power supply voltage and a pixel power supply voltage line 111 arranged correspondingly to the pixel region 160 to connect the upper power supply voltage line 110 and the lower power supply voltage line 130. It may further include a scan driver 140 for outputting selection signals and a data driver 150 for outputting data signals.

Furthermore, the organic electroluminescent display device 100 may additionally include a cathode electrode 122 arranged correspondingly to the pixel region 160, and a cathode power supply line 120 (not shown in FIG. 1) formed at one side of the pixel region 160. The cathode power supply line 120 may be equipped with contact holes for connecting the cathode power supply line 120 to the cathode electrode 122.

FIG. 2 illustrates a plane structure of a cathode power supply line equipped with one contact hole for connecting the cathode power supply line to the cathode electrode in a conventional organic electroluminescent display device.

As shown in FIG. 2, one contact hole 121 may be arranged on a cathode power supply line 120 so that the cathode power supply line 120 is connected to a cathode electrode 122 through the contact hole 121. A cathode voltage supplied to the cathode power supply line 120 from an external terminal may be supplied to the cathode electrode 122 through the contact hole 121.

In a conventional organic electroluminescent display device having the foregoing structure, if selection signals and data signals are provided to the pixel region 160 from the scan driver 140 and data driver 150, power supply voltage may be provided to the pixel power supply voltage line 111 from the power supply voltage lines 110 and 130. The cathode voltage may be provided to the cathode electrode 122 from the cathode power supply line 120. Switching transistor and driving transistor (not shown in FIG. 2) composing pixels arranged on the pixel region 160 may be driven so that electroluminescent elements (not shown in FIG. 2) emit lights.

FIG. 3 illustrates conventional distribution of power supply voltage supplied to the pixel region 160 from the power supply voltage lines 110 and 130 in an organic electroluminescent display device illustrated on FIG. 1.

As shown in FIG. 3, the distribution of the power supply voltage in the pixel region 160 may be divided into a region to which a relatively lower power supply voltage is provided, and one in which a relatively higher power supply voltage is provided. These may be selected based on the distance from the power supplying component, because the farther away the pixel region 160 is from a power supply voltage supplying component, the greater the voltage drop is. This voltage drop may be attributed to resistance loss (IR loss) in the line. Furthermore, the same effect can be observed in the cathode power supply lines.

That is, a relatively higher power supply voltage may be supplied to a part adjacent to the power supply voltage supplying side of the circuit, than to the remainder of the line. Similarly, a relatively higher cathode voltage may be supplied to a part adjacent to an external terminal, than to the more distant parts.

There have been conventional problems with non-uniformity of luminance in the pixel region. These problems may be further worsened because the part that experiences the voltage drop of the cathode electrode may also be the part having a high voltage drop of power supply voltage in the pixel region. Thus the two regions may overlap. Furthermore, there also have been conventional problems that emission luminance of the pixel region may become even less uniform because the cathode power supply line may be only at one side of the pixel region.

SUMMARY OF THE INVENTION

Therefore, in order to solve the foregoing problems of the prior art, the present invention provides an organic electroluminescent display device capable of improving luminance uniformity by arranging cathode bus lines at least at both sides of the pixel region, thereby compensating for the voltage drop of the power supply voltage.

The present invention also provides an organic electroluminescent display device capable of compensating to avoid non-uniformity of luminance due to voltage drop of the power supply voltage by asymmetrically forming a plurality of contact holes for connecting cathode electrode and cathode power supply line.

The present invention provides, for example, an organic electroluminescent display device that may include a pixel region on which a plurality of pixels respectively comprising first and second electrodes and an organic thin film layer interposed between the first and second electrodes. It may also include a first power supply line for supplying voltage of first level to the pixels of the pixel region and a second power supply line for supplying voltage of a second level to the second electrode. It may also include at least a region superposed on the second electrode, wherein the second power supply line include a plurality of contact holes through which the second power supply line are connected to the second electrode. The plurality of contact holes may be asymmetrically arranged with respect to a bisector of the superposition region of the second power supply line and second electrode.

The contact holes may be arranged on at least two or more superposition regions. The area of the contact holes in a region having a high voltage drop may be larger than that of the contact holes in a region having a low voltage drop.

Furthermore, at least two or more of the contact holes may be arranged in a direction of long axis of the second power supply line, and lengths of the contact holes may differ from each other in the direction of the long axis of the second power supply line. Length of the contact holes in the long axis direction of the second power supply line in a region having high voltage drop may be longer than that of the contact holes in the long axis direction of the second power supply line in a region having low voltage drop.

Furthermore, at least three or more of the contact holes may be formed in a long axis direction of the second power supply line. A gap between two adjacent contact holes arranged in the long axis direction of the second power supply line in the region having high voltage drop may differ from a gap between two adjacent contact holes arranged in the long axis direction of the second power supply line in the region having low voltage drop. The gap between two adjacent contact holes arranged in the long axis direction of the second power supply line in the region having high voltage drop may be shorter than the gap between two adjacent contact holes arranged in the long axis direction of the second power supply line in the region having low voltage drop.

Furthermore, at least two or more of the contact holes may be arranged in a short axis direction of the second power supply line. The lengths of the contact holes arranged in the long axis direction of the second power supply line may differ from each other. The total length of the contact holes on the short axis direction of the second power supply line in the region having high voltage drop may surpass that of the contact holes on the short axis direction of the second power supply line in the region having low voltage drop.

The number of contact holes arranged in the short axis direction of the second power supply line may be different from the number of the contact holes arranged in the long axis direction of the second power supply line in regions having high and low voltage drops respectively. The contact holes may be arranged such that a gap between adjacent holes at a part having high voltage drop is equal to a gap between the adjacent contact holes at a part having low voltage drop.

Furthermore, the contact holes may be arranged such that a gap between adjacent holes at a part having high voltage drop is different from a gap between the adjacent contact holes at a part having low voltage drop. The contact holes may be arranged such that the gap between the adjacent contact holes decreases at the part having higher voltage drop compared to the part having lower voltage drop. Sizes of the contact holes may be equal to each other.

The number of contact holes arranged in the short axis direction of the second power supply line may be equal to the number of the contact holes arranged in the long axis direction of the second power supply line in regions having high and low voltage drops respectively. The contact holes may be arranged such that a gap between adjacent holes at a part having high voltage drop is different from a gap between the adjacent contact holes at a part having low voltage drop. The contact holes may be arranged such that the gap between the adjacent contact holes may decrease at the part having high voltage drop compared to the part having low voltage drop.

Furthermore, sizes of contact holes arranged in a long axis direction or short axis direction of the second power supply line may be different from each other, and a plurality of the contact holes may be arranged such that the total length of the contact holes decreases from a part having high voltage drop to a part having low voltage drop.

Furthermore, the present invention may also include an organic electroluminescent display device having a pixel region on which a plurality of pixels respectively comprising first and second electrodes and an organic thin film layer interposed between the first and second electrodes. The display device may also include first power supply line for supplying voltage of first level to the pixels of the pixel region and second power supply line for supplying voltage of a second level to the second electrode and comprising at least a region superposed on the second electrode.

The second power supply lines are arranged on at least two side surfaces in a plurality of side surfaces of the pixel region, at least one second power supply line in second power supply lines arranged on the two side surfaces comprises a plurality of contact holes through which the second power supply lines are connected to the second electrode, and the plurality of contact holes are asymmetrically arranged with respect to a bisector of the superposition region of the second power supply lines and second electrode.

Furthermore, the present invention may include an organic electroluminescent display device with a pixel region on which a plurality of pixels respectively comprising first and second electrodes and an organic thin film layer interposed between the first and second electrodes. It may also include a first power supply line for supplying voltage of a first level to the pixels of the pixel region; and a second power supply line for supplying voltage of a second level to the second electrode. It may also include at least a region superposed on the second electrode. The second power supply line may be arranged on at least one side surface in a plurality of side surfaces of the pixel region and equipped with a plurality of contact holes. The total circumference of the plurality of contact holes may be longer than a circumference of the superposition region of the second electrode and the second power supply line. At least two or more of the contact holes may be arranged in a direction of long axis of the second power supply line. The lengths of the contact holes may differ from each other in the direction of the long axis of the second power supply line. The area of the contact holes in a region having high voltage drop may be larger than that of the contact holes in a region having low voltage drop.

Furthermore, at least three or more of the contact holes may be formed in a long axis direction of the second power supply line, and a gap between two adjacent contact holes arranged in the long axis direction of the second power supply lines in the region having high voltage drop may be different from a gap between two adjacent contact holes arranged in the long axis direction of the second power supply line in the region having low voltage drop.

The number of contact holes arranged in the short axis direction of the second power supply line may differ from the number of the contact holes arranged in the long axis direction of the second power supply line in regions having high and low voltage drops respectively. The contact holes may be arranged such that a gap between adjacent holes at a part having high voltage drop differs from a gap between the adjacent contact holes at a part having low voltage drop. Furthermore, the contact holes may be arranged such that the gap between the adjacent contact holes is less at the part having higher voltage drop. The numbers of contact holes arranged in each column may be equal to each other. Sizes of contact holes arranged in each column and row may be equal to each other. Sizes of contact holes arranged in each column and row may differ from each other, and a plurality of the contact holes may be arranged such that the total length of the contact holes decreases from a part having high voltage drop to a part having low voltage drop.

BRIEF DESCRIPTION OF THE DRAWINGS

FIG. 4C is a drawing for schematically showing distribution of power supply voltage in another organic electroluminescent display device comprising two cathode power supply lines of the present invention.

DETAILED DESCRIPTION OF THE INVENTION

Figure 1:
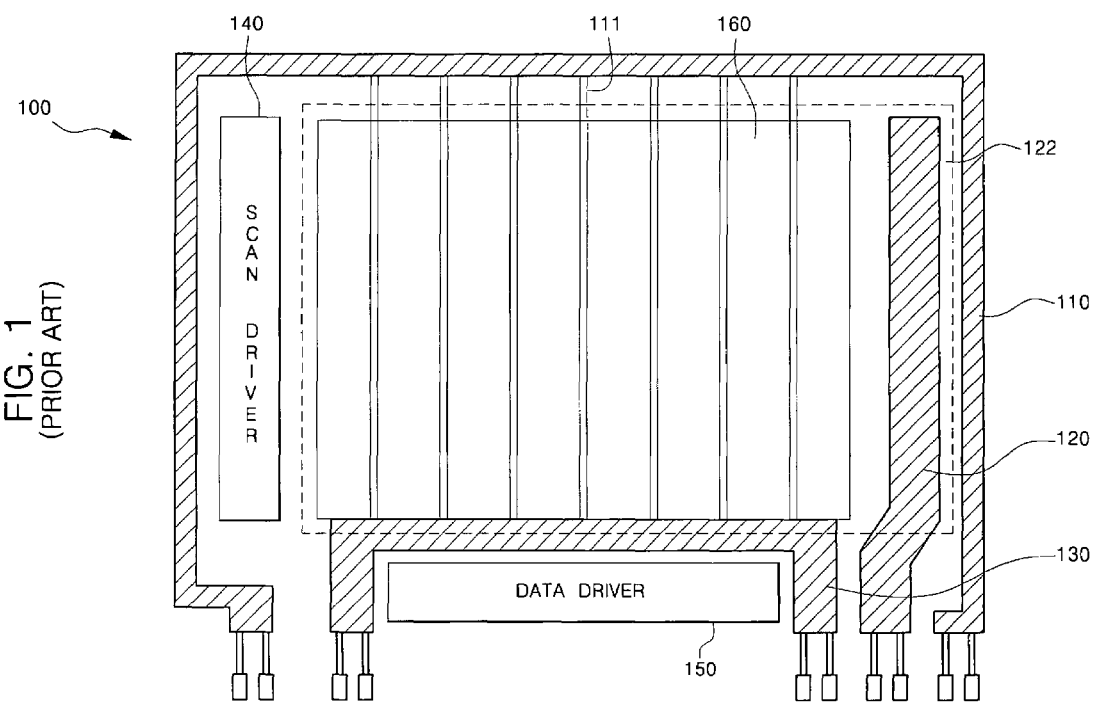
FIG. 1 is a plane figure for showing a conventional organic electroluminescent display device.
Figure 2:
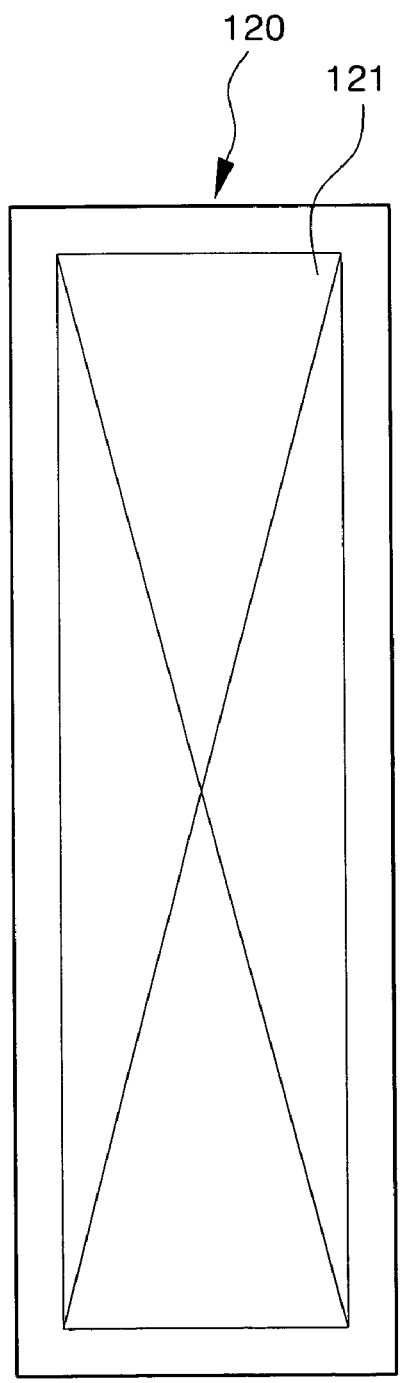
FIG. 2 is a plane figure of cathode power supply lines comprising contact holes through which the cathode power supply lines are connected to cathode electrode in a conventional organic electroluminescent display device.

The present invention will now be described in detail in connection with preferred embodiments with reference to the accompanying drawings. Like reference characters designate corresponding parts throughout several views.

In general, the drawing include depictions of organic electroluminescent display device 200, upper power supply voltage line 210, pixel power supply voltage line 211, cathode electrode 220, first cathode power supply line 221, second cathode power supply line 222, contact holes 223, 224, 225, 226, 227a and 227b, 228a, 228b, and 228c, lower power supply voltage line 230, scan driver 240, and data driver 250.

Figure 5:
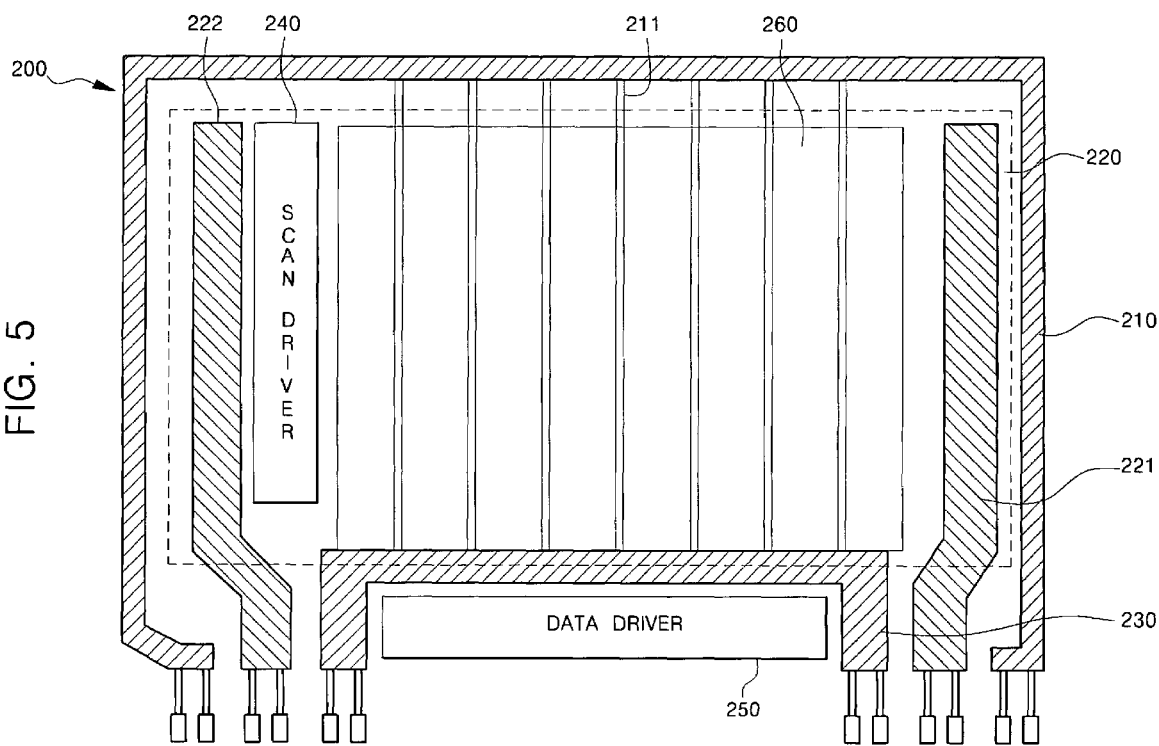
FIG. 5 is a plane figure for showing an organic electroluminescent display device according to a preferred embodiment of the present invention.

As shown in FIG. 5, an organic electroluminescent display device 200 may include a pixel region 260 on which a plurality of pixels are arranged, upper power supply voltage lines 210 arranged at an upper side and left and right sides of the pixel region 260 to supply power supply voltage to the pixel region 260, and lower power supply voltage lines 230 arranged at a lower side of the pixel region 260 to supply power supply voltage to the pixel region 260. It may also include pixel power supply voltage lines 211 arranged in correspondence to the pixel region 260 such that the pixel power supply voltage lines 211 are connected to the upper power supply voltage lines 210 and the lower power supply voltage lines 230. It may also include a scan driver 240 for outputting selection signals to the pixel region 260 and a data driver 250 for outputting data signals to the pixel region 260.

Furthermore, the organic electroluminescent display device may also include a cathode electrode 220 arranged on an upper part of the pixel region 260, first cathode power supply lines 221 arranged at one side of the pixel region 260 such that the first cathode power supply lines 221 overlap the cathode electrode 220 to supply cathode voltage to the cathode electrode 220, and second cathode power supply lines 222 arranged at other side of the pixel region 260 such that the second cathode power supply lines 222 overlap the cathode electrode 220 to supply cathode voltage to the cathode electrode 220.

Each of the first and second cathode power supply lines 221 and 222 may include a plurality of contact holes 223 through which the first and second cathode power supply lines 221 and 222 are connected to the cathode electrode 220. The plurality of contact holes 223 of the first and second cathode power supply lines 221 and 222 may be asymmetrically arranged. At least two or more of the contact holes may be asymmetrically arranged to compensate voltage drop generated through the cathode power supply lines as illustrated in FIGS. 6, 7, 8, 9, 10, 11, and 12.

Figure 6:
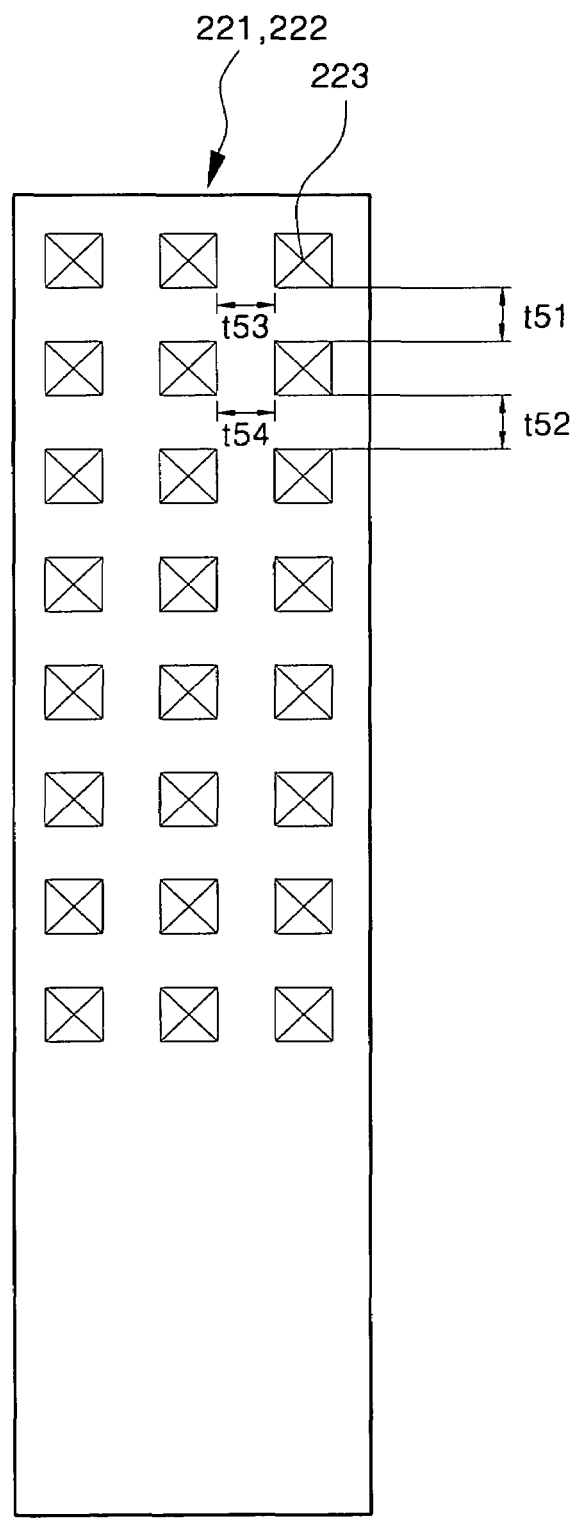
FIG. 6 is a plane figure of cathode power supply lines comprising a plurality of contact holes through which the cathode power supply lines are connected to cathode electrode in an organic electroluminescent display device according to a first preferred embodiment of the present invention.

FIG. 6 illustrates a plane structure of cathode power supply lines in an organic electroluminescent display device according to a first preferred embodiment of the present invention. FIG. 6 illustrates only a region overlapping the cathode electrode 220.

As shown in FIG. 6, a plurality of contact holes may be asymmetrically arranged on a region where the respective cathode power supply lines 221 and 222 overlap the cathode electrode 220. The plurality of contact holes 223 may be asymmetrically arranged with respect to a bisector in a long axis direction of a superposition region of the cathode power supply lines 221 and 222 with the cathode electrode. That is, the contact holes 223 may not be arranged on a part adjacent to an external terminal to which cathode voltage is supplied in the region superposed on the cathode electrode 220, but a plurality of contact holes 223 may be arranged on a part spaced apart from the external terminal to which the cathode voltage is supplied.

A plurality of contact holes 223 may be arranged in a matrix shape of columns and rows with the same pitch being maintained between adjacent contact holes, the size of the respective contact holes may be equal to each other, and the number of contact holes arranged in each column and row (i.e., in long and short axial directions) may be equal.

In an organic electroluminescent display device, a power supply voltage supplied to the pixel region 260 from the upper and lower power supply voltage lines 210 and 230 through the pixel power supply voltage line 211 may be distributed differently according to the position of the power supply voltage lines 210 and 230. That is, power supply voltage may be higher due to a relatively smaller voltage drop at a part that is close to an external terminal while power supply voltage may be lower due to a relatively larger voltage drop at a part that is far from the external terminal.

Figure 3:
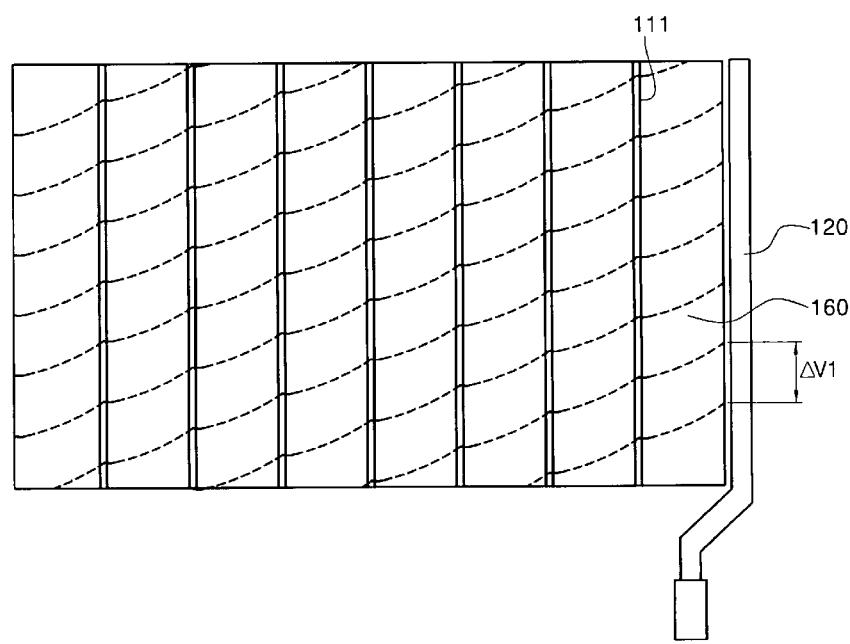
FIG. 3 is a drawing for showing distribution of power supply voltage in an organic electroluminescent display device of FIG. 1.

As illustrated in FIG. 3, when a power supply voltage is supplied to the pixel region 260 through the power supply voltage lines 210 and 230, low power supply voltage may be supplied to pixels arranged at an upper side of the pixel region 260 that is far from the external terminal because voltage drop of the power supply voltage lines 210 and 230 is relatively larger. Similarly, high power supply voltage may be supplied to pixels arranged at a lower side of the pixel region 260 because voltage drop of the power supply voltage lines 210 and 230 is relatively smaller.

As shown in FIG. 6, therefore, a plurality of contact holes 223 may be formed at a part having a large voltage drop of power supply voltage lines in the cathode power supply lines 221 and 222, and the contact holes 223 may not be formed at a part having a small voltage drop of the power supply voltage lines 210 and 230 in the cathode power supply lines 221 and 222 in an organic electroluminescent display device. That is, in the contact holes 223 arranged on the cathode power supply lines 221 and 222, the same number of at least two or more of the contact holes 223 may be formed on a part having a large voltage drop in long and short axial directions (distances t53 and t54 between adjacent contact holes 223 in a short axial direction may be equal to each other and distances t51 and t52 between adjacent contact holes 223 in a long axial direction are equal to each other). Therefore, current density at the cathode power supply lines 221 and 222 may be concentrated on the circumferential part of the contact holes 223, and current density at the central part of the contact holes 223 may be reduced.

Therefore, the total length of the contact holes obtained by summing up the circumference of the respective contact holes may increase so that current mobility of the cathode power supply lines may increase. Also the voltage drop of cathode bus lines may accordingly be prevented if a plurality of contact holes are formed as in an organic electroluminescent display device. It may be preferable that the sum of the circumference of a plurality of contact holes arranged on a region where the cathode electrode and cathode power supply lines overlap each other is larger than the circumference of the superposition region of the cathode electrode and cathode power supply lines.

Therefore, the voltage drop of the cathode power supply lines may be large because contact holes are not formed at a part having a small voltage drop of power supply lines in the cathode power supply lines 221 and 222 as in the present invention (e.g., a part that is close to an external terminal). The voltage drop of the cathode power supply lines may be small because a plurality of contact holes may be formed at a part having a large voltage drop of the power supply lines (e.g., a part that is far from the external terminal).

Voltage drop of the cathode power supply lines 221 and 222 may decrease by arranging a plurality of contact holes 223 on the cathode power supply lines 221 and 222 correspondingly to a part having a large voltage drop of the power supply voltage lines 210 and 230 on a pixel region 260 in a region overlapping the cathode electrode 220. Thus, current provided to the cathode through the anode of an organic electroluminescent device (not illustrated on drawings) may be concentrated on a plurality of contact holes 223 arranged on the cathode power supply lines 221 and 222 while voltage drop of the cathode power supply lines 221 and 222 increases by not forming the contact holes corresponding to a part having a small voltage drop of the power supply voltage lines 210 and 230.

Therefore, in a first preferred embodiment of the present invention, voltage drop of the cathode power supply lines may be compensated by forming cathode power supply lines at both sides of the pixel region, and power supply voltage distribution may be obtained as in FIG. 4C by asymmetrically forming a plurality of contact holes on the cathode power supply lines. This may prevent voltage drop along the cathode power supply lines. It can be seen from FIG. 4C that equipotential lines may be formed in a horizontal symmetrical structure by arranging the cathode voltage lines at both sides of the pixel region and asymmetrically forming a plurality of contact holes on the cathode power supply lines. A distance ΔV4 between the equipotential lines may be larger than a distance ΔV1 between conventional equipotential lines illustrated in FIG. 3.

Figure 4A:
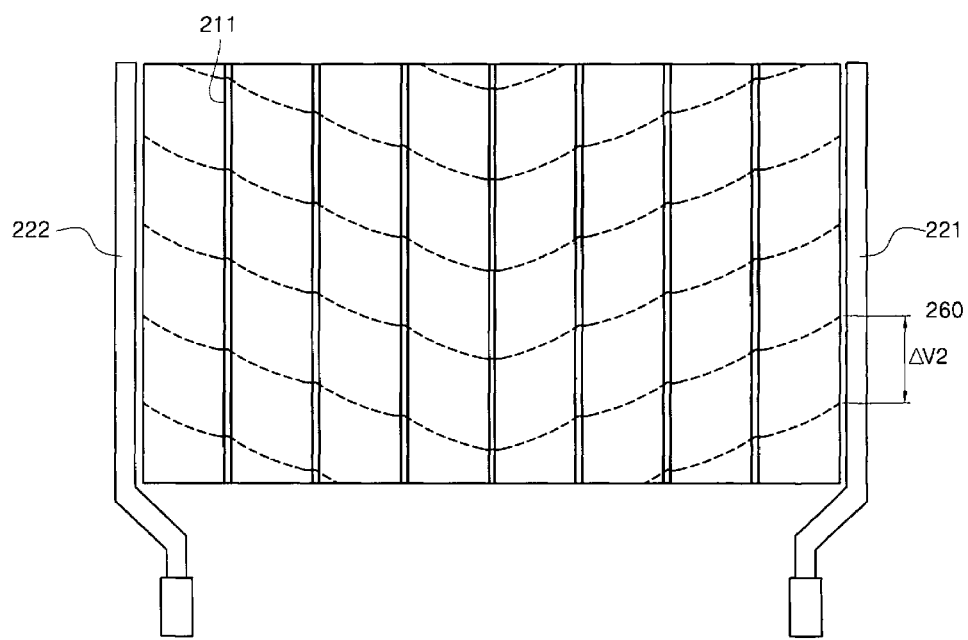
FIG. 4A is a drawing for schematically showing distribution of power supply voltage in an organic electroluminescent display device comprising two cathode power supply lines of the present invention.
Figure 4B:
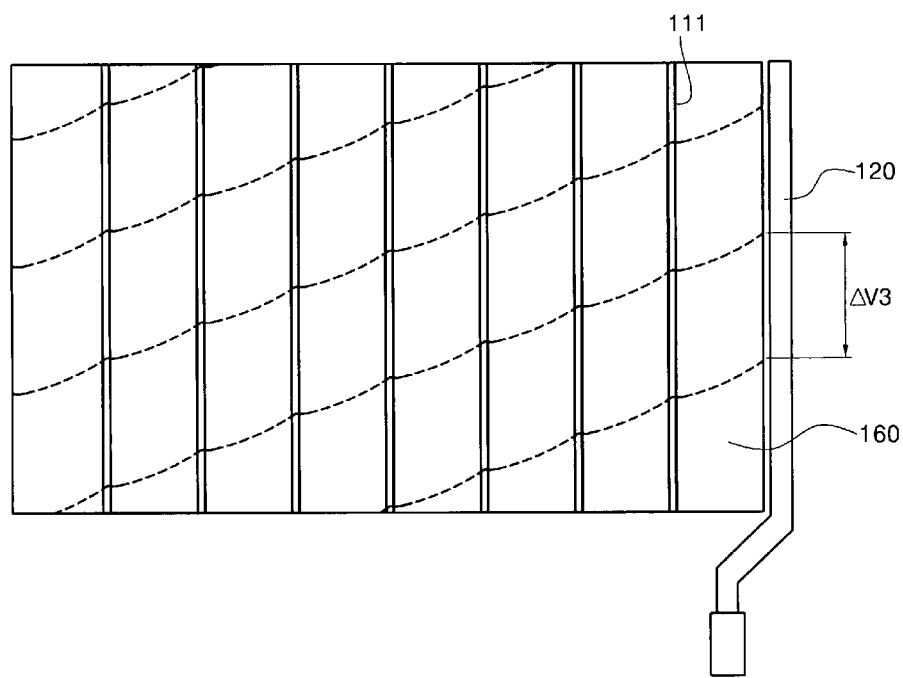
FIG. 4B is a drawing for schematically showing distribution of power supply voltage in an organic electroluminescent display device comprising one cathode power supply line of the present invention.

Although cathode power supply lines may be arranged at both sides of a pixel region, distribution of power supply voltage as illustrated in FIG. 4B can be obtained even if the contact holes are arranged only at one side of the pixel region as in FIG. 1, so long as a plurality of the contact holes are asymmetrically arranged. Voltage drop of the power supply voltages can be compensated because a distance ΔV2 between equipotential lines of the cathode power supply lines is greater than the distance ΔV1 between conventional equipotential lines illustrated in FIG. 3.

Furthermore, if the cathode power supply lines are arranged at both sides of the pixel region, a plurality of contact holes may be symmetrically arranged. As illustrated in FIG. 4A, the equipotential lines of power supply voltages may be horizontally symmetrically arranged, and a distance ΔV3 between the equipotential lines of the power supply voltages may be larger than the distance ΔV1 between the conventional equipotential lines illustrated in FIG. 3. Therefore, voltage drop of the power supply voltages can be compensated by asymmetrically arranging a plurality of contact holes on at least one side surface among a plurality of side surfaces of pixels in the present invention to prevent voltage drop of the cathode power supply lines.

It can be seen that distances ΔV2, ΔV3, and ΔV4 between equipotential lines of the present invention are larger than the distance ΔV1 between the conventional equipotential lines because voltage drop of the cathode power supply lines is reduced. Compare FIGS. 4A, 4B, and 4C to FIG. 3. That is, a distance ΔV3 or ΔV4 when a plurality of contact holes are asymmetrically arranged may be larger than a distance ΔV2 when a plurality of contact holes are symmetrically arranged. Moreover, the distance ΔV2 may be larger than the distance ΔV1 between the conventional equipotential lines.

Therefore, voltage drop in power supply voltage lines can be compensated by guiding voltage drop in cathode power supply lines opposite to voltage drop of the power supply voltage lines. Luminance non-uniformity because of voltage drop of the power supply lines can thus be improved.

Figure 7:
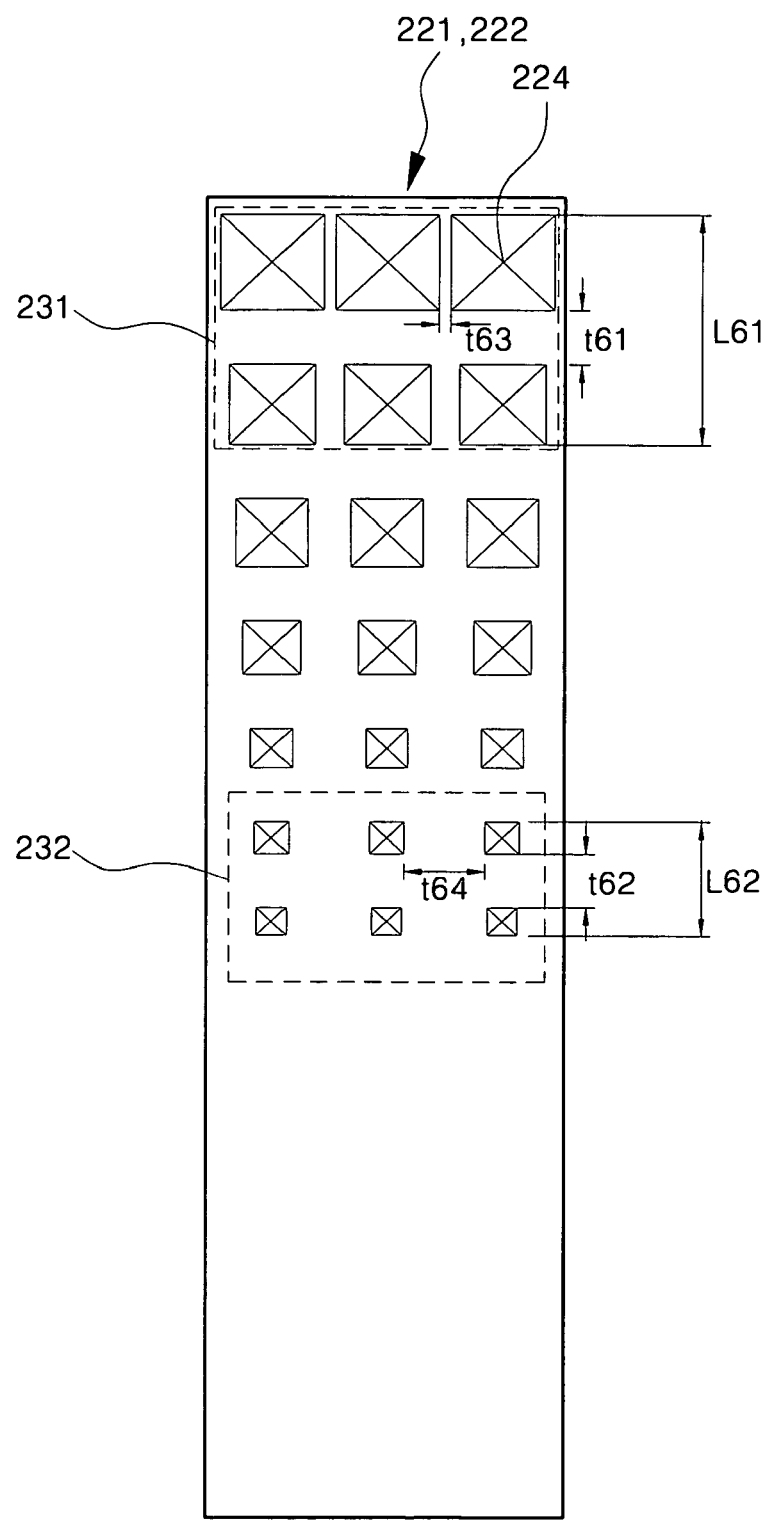
FIG. 7 is a plane figure of cathode power supply lines comprising a plurality of contact holes through which the cathode power supply lines are connected to cathode electrode in an organic electroluminescent display device according to a second preferred embodiment of the present invention.

FIG. 7 illustrates a plane structure of cathode power supply lines comprising contact holes for connecting the cathode power supply lines to cathode electrode in an organic electroluminescent display device according to a second preferred embodiment of the present invention.

As shown in FIG. 7, a plurality of contact holes 224 may be asymmetrically arranged in a region overlapping cathode electrode 220 in the cathode power supply lines 221 and 222. The plurality of contact holes 224 may be asymmetrically arranged with respect to an equipotential line in a long axial line of a region overlapping the cathode electrode in the cathode power supply lines 221 and 222. That is, the contact holes 224 may not be arranged at a part adjacent to an external terminal to which cathode voltage is supplied, but the contact holes 224 may be arranged a certain distance spaced apart from the external terminal to which cathode voltage is supplied.

At least two or more contact holes may be arranged in each column and row so that the number of contact holes in each row is equal, and the number of contact holes in each column is equal. This may be achieved by arranging the plurality of contact holes 224 in a matrix shape of columns and rows.

The farther the contact holes 224 are from an external terminal of cathode power supply lines 221 and 222, the larger the contact holes 224 may be. The distances t61 and t62 between adjacent contact holes in a long axial direction may be equal. A distance t63 between the contact holes 224 in a short axial direction adjacent to a region 231 having a large voltage drop of power supply voltage in the cathode power supply lines overlapping the cathode electrode may be shorter than a distance t64 between contact holes 224 in a short axial direction adjacent to a region 232 having a small voltage drop. Therefore, the area of contact holes 224 included in each row may be larger in the region 231 having a large voltage drop compared to the region 232 having a small voltage drop as described in the above.

That is, the total circumference and total area of the contact holes in a region 231 having a large voltage drop may be larger than the total circumference and total area of the contact holes in a region 232 having a small voltage drop. This may be because two contact holes adjacent to a region 231 having a large voltage drop and a distance L61 between the two contact holes may be larger than two contact holes adjacent to a region 232 having a small voltage drop and a distance L62 between the two contact holes.

Therefore, voltage drop according to deviation of size and distance between contact holes 224 arranged may be generated because current density may increase from a part having a small voltage drop to a part having a large voltage drop. Therefore, voltage distribution of the cathode power supply lines 221 and 222 may offset voltage drop of the power supply voltage lines 210 and 230 because the cathode power supply lines 221 and 222 may have voltage distribution directly opposite to the voltage distribution of the power supply voltage lines 210 and 230. The total circumference of a plurality of contact holes 224 arranged on a region where cathode electrode and cathode power supply lines overlap each other may be larger than the circumference of the superposition region of the cathode electrode and cathode power supply lines.

Figure 8:
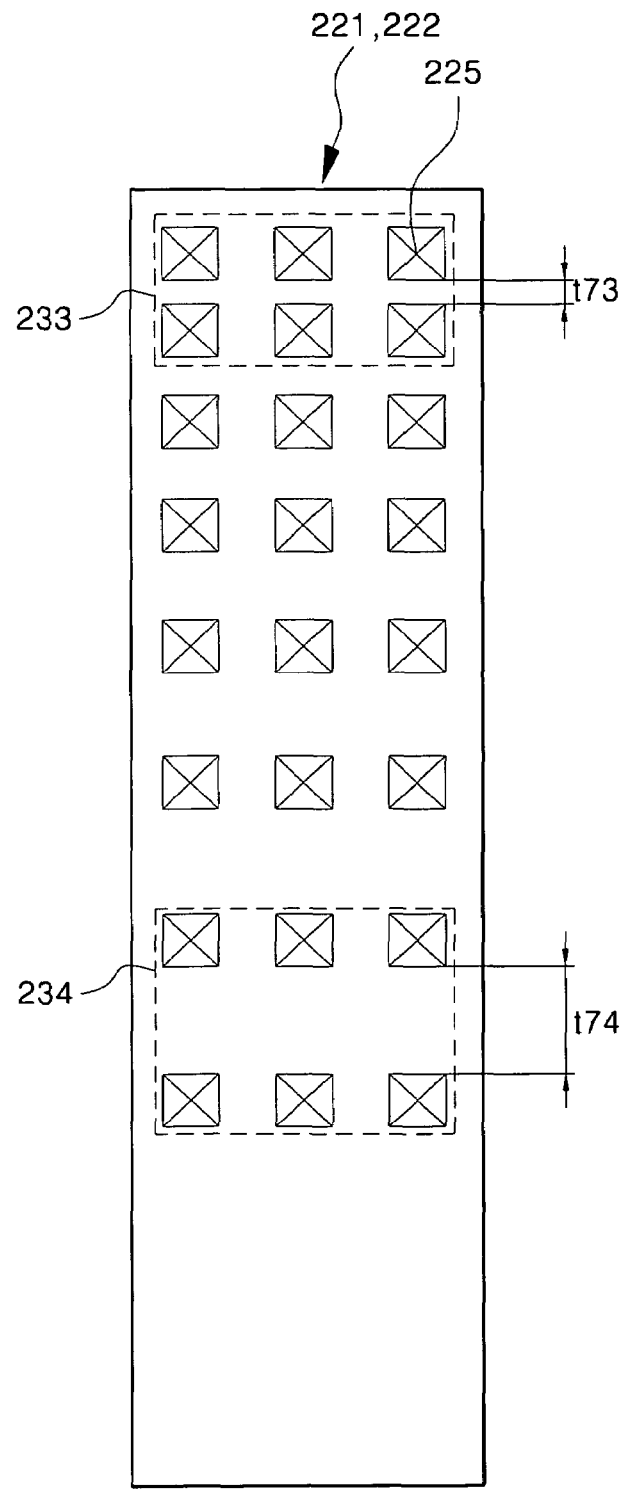
FIG. 8 is a plane figure of cathode power supply lines comprising a plurality of contact holes through which the cathode power supply lines are connected to cathode electrode in an organic electroluminescent display device according to a third preferred embodiment of the present invention.

As shown in FIG. 8, a plurality of contact holes 225 may be asymmetrically arranged in a region overlapping cathode electrode 220 in the cathode power supply lines 221 and 222. The plurality of contact holes 225 may be asymmetrically arranged with respect to an equipotential line in a long axial line of a region overlapping the cathode electrode in the cathode power supply lines 221 and 222. That is, the contact holes 225 may not be arranged at a part adjacent to an external terminal to which cathode voltage is supplied in the region overlapping the cathode electrode 220, but a plurality of the contact holes 225 may be arranged at a distance from the external terminal to which cathode voltage is supplied.

According to a third preferred embodiment of the present invention, a plurality of contact holes 225 may be arranged in a matrix shape of columns and rows so that the number of contact holes arranged at each row is equal, and the number of contact holes arranged at each column is equal, and sizes of the contact holes are equal to each other.

Three or more contact holes may be arranged in a long axial direction of cathode power supply lines, and a distance t73 between contact holes in a region 233 having a large voltage drop may be smaller than a distance t74 between contact holes in a region 234 having a small voltage drop.

Therefore, the distance difference between contact holes 225 may generate a voltage drop because current density increases from a part having a small voltage drop to a part having a large voltage drop. Therefore, voltage distribution of the cathode power supply lines 221 and 222 may offset voltage drop of the power supply voltage lines 210 and 230. This may be because the cathode power supply lines 221 and 222 have voltage distribution directly opposite to the voltage distribution of the power supply voltage lines 210 and 230. The total circumference of a plurality of contact holes 225 arranged on a region where cathode electrode and cathode power supply lines overlap each other may be larger than the circumference of the superposition region of the cathode electrode and cathode power supply lines.

Figure 9:
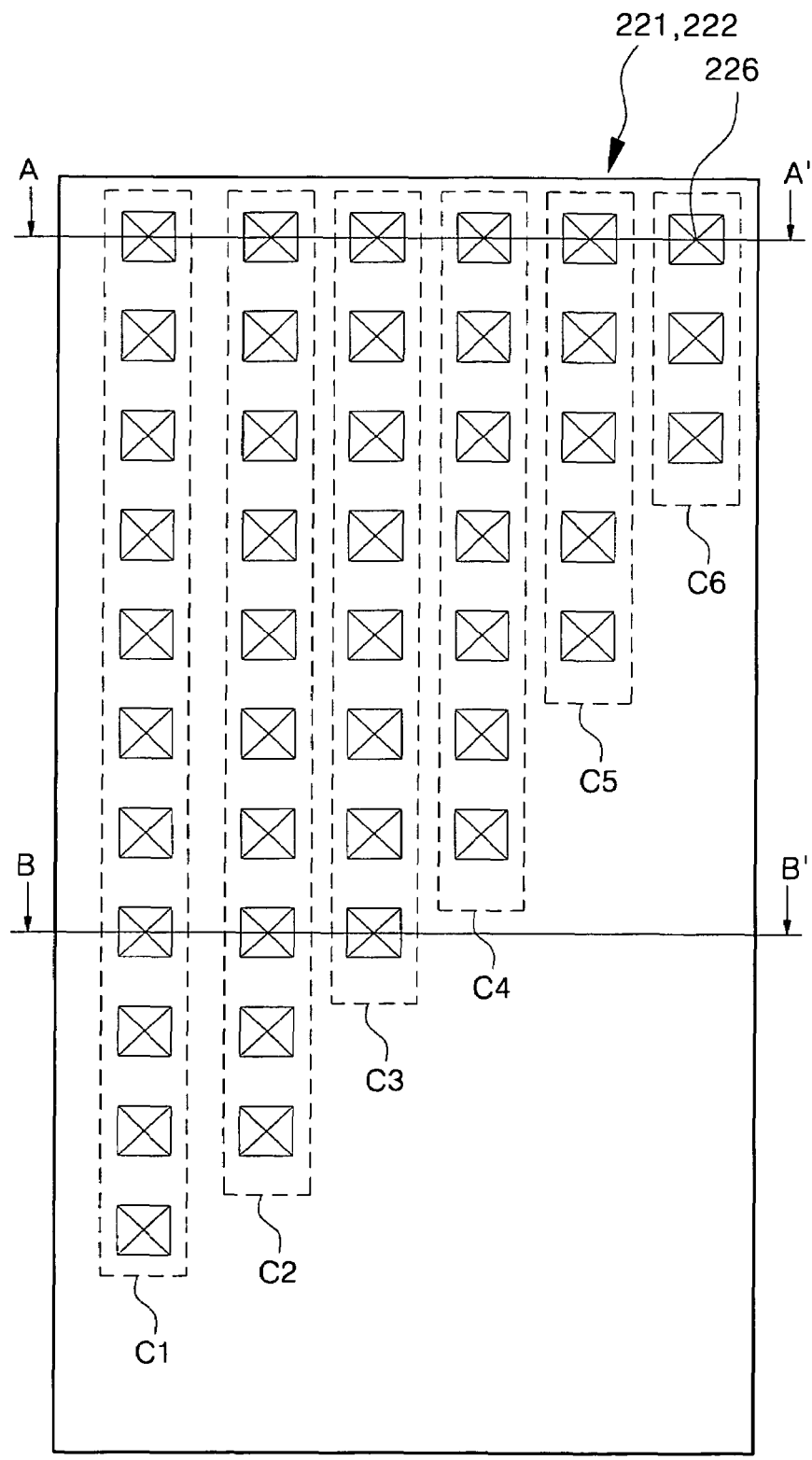
FIG. 9 is a plane figure of cathode power supply lines comprising a plurality of contact holes through which the cathode power supply lines are connected to cathode electrode in an organic electroluminescent display device according to a fourth preferred embodiment of the present invention.

As shown in FIG. 9, a plurality of contact holes 226 may be asymmetrically arranged in a region overlapping cathode electrode 220 in the cathode power supply lines 221 and 222. The contact holes 226 may be asymmetrically arranged with respect to an equipotential line in a long axial line of a region overlapping the cathode electrode in the cathode power supply lines 221 and 222. That is, the contact holes 226 may not be arranged at a part adjacent to an external terminal to which cathode voltage is supplied, but the contact holes 226 may be arranged at a distance from the external terminal to which cathode voltage is supplied.

Although the distance between adjacent contact holes 226 may be equal between a part having a large voltage drop and a part having a small voltage drop, the number of contact holes 225 arranged in each column may be different according to the voltage drop of the power supply voltage lines 210 and 230. The size of contact holes arranged on each column may be equal. At least two or more contact holes may be arranged in a short axial direction of the cathode power supply lines, and different numbers of contact holes may be arranged in a long axial direction of the cathode supply lines.

Therefore, the sum of lengths C1, C2, C3, C4, C5, and C6 of the contact holes 226 of an AA' region having a large voltage drop may be larger than the sum of lengths C1, C2 and C3 of the contact holes 226 of a BB' region having a small voltage drop. This may be because the number of contact holes arranged in a long axial direction of the cathode power supply lines according to voltage drop of power supply voltage may be different if the sizes of contact holes arranged in each column in a short axial direction of cathode power supply lines are C1, C2, C3, C4, C5 and C6.

Therefore, current density may increase, because the larger the voltage drop of the power supply voltage lines 210 and 230 is, the greater the number of the contact holes 226 arranged in a short axial direction of cathode power supply lines may be. Thus the current density may be reduced to offset the voltage drop of the power supply voltage lines 210 and 230. This may be because the smaller the voltage drop is, the fewer the number of the contact holes 226. The total circumference of a plurality of contact holes 226 arranged a region where the cathode electrode overlaps the cathode power supply lines may be larger than the circumference of a superposition region of the cathode electrode and cathode power supply lines.

Figure 10:
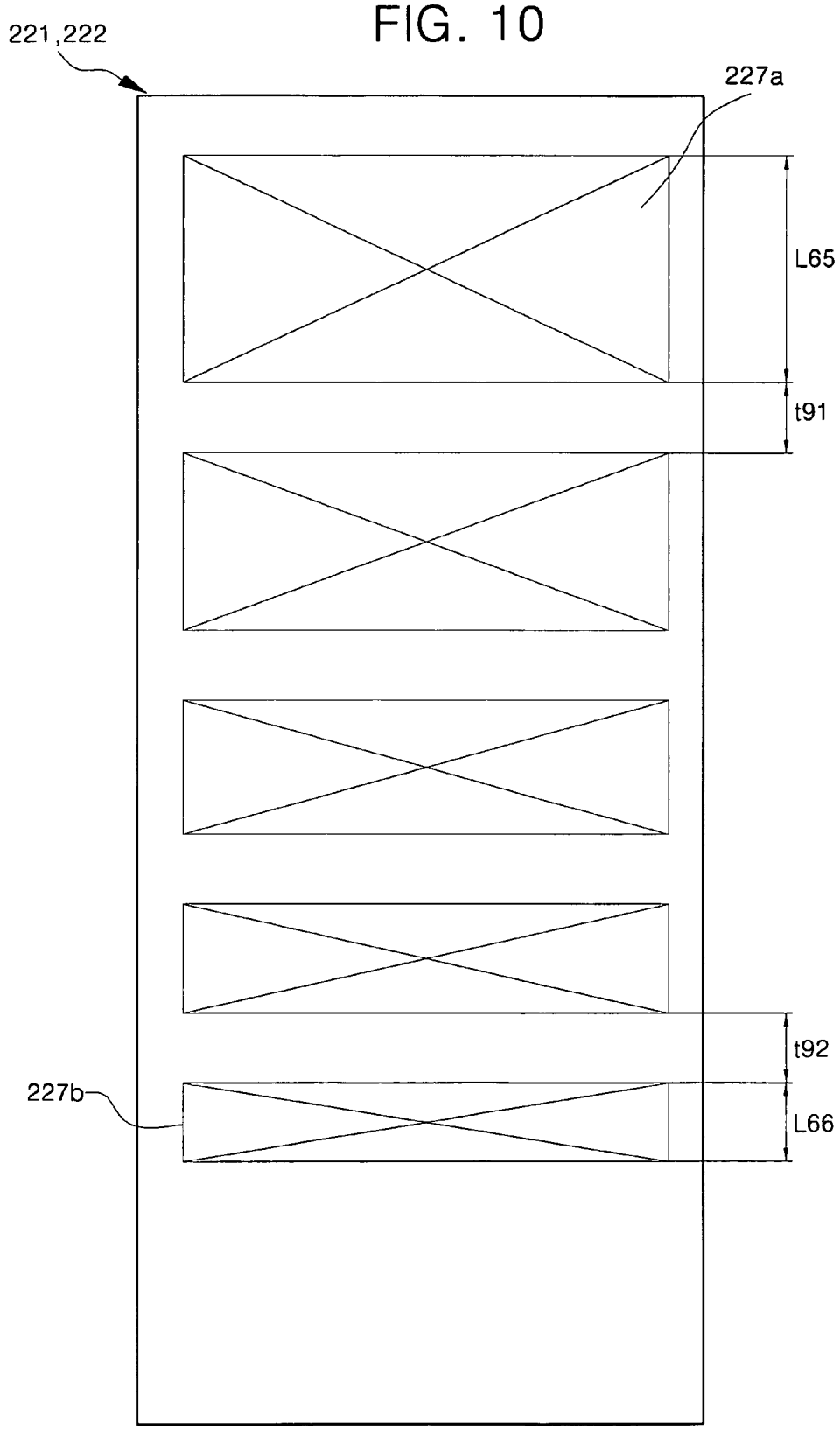
FIG. 10 is a plane figure of cathode power supply lines comprising a plurality of contact holes through which the cathode power supply lines are connected to cathode electrode in an organic electroluminescent display device according to a fifth preferred embodiment of the present invention.

As shown in FIG. 10, a plurality of contact holes 227a and 227b may be asymmetrically arranged in a region overlapping cathode electrode 220 in the cathode power supply lines 221 and 222. The plurality of contact holes 227a and 227b may be asymmetrically arranged with respect to an equipotential line in a long axial line of a region overlapping the cathode electrode in the cathode power supply lines 221 and 222. That is, the contact holes 227a and 227b may not be arranged at a part adjacent to an external terminal to which cathode voltage is supplied in the region overlapping the cathode electrode 220, but a plurality of the contact holes 227a and 227b may be arranged at a distance from the external terminal to which cathode voltage is supplied.

The contact holes may be arranged in a row in a long axial direction of the cathode power supply lines 221 and 222. Distances t91 and t92 between adjacent contact holes may be equal to each other. The sizes of the contact holes may be different from each other. At least two or more of the contact holes may be arranged in a long axial direction of the cathode power supply lines. Length L66 in a long axial direction of the cathode power supply lines 221 and 222 of the contact hole 227b in a region having a small voltage drop may be shorter than length L65 in a long axial direction of the cathode power supply lines 221 and 222 of the contact hole 227a in a region having a large voltage drop.

Furthermore, the area of the contact hole 227a in the region having a large voltage drop may be larger than area of the contact hole 227b in the region having a small voltage drop. This may be the case if the area of the contact hole 227a in the region having a large voltage drop is S1, and the area of the contact hole 227b in the region having a small voltage drop is S2. The total circumference of a plurality of contact holes arranged in a region where the cathode electrode and cathode power supply lines overlap may be longer than the circumference of a superposition region of the cathode electrode and cathode power supply lines.

Therefore, voltage drop may be generated according to the size of contact holes 227a and 227b. This is because current density may increase from a part having a small voltage drop to a part having a large voltage drop. Therefore, voltage distribution of the cathode power supply lines 221 and 222 may offset voltage drop of the power supply voltage lines 210 and 230. This may be because the cathode power supply lines 221 and 222 have voltage distribution directly opposite to voltage distribution of the power supply voltage lines 210 and 230.

Figure 11:
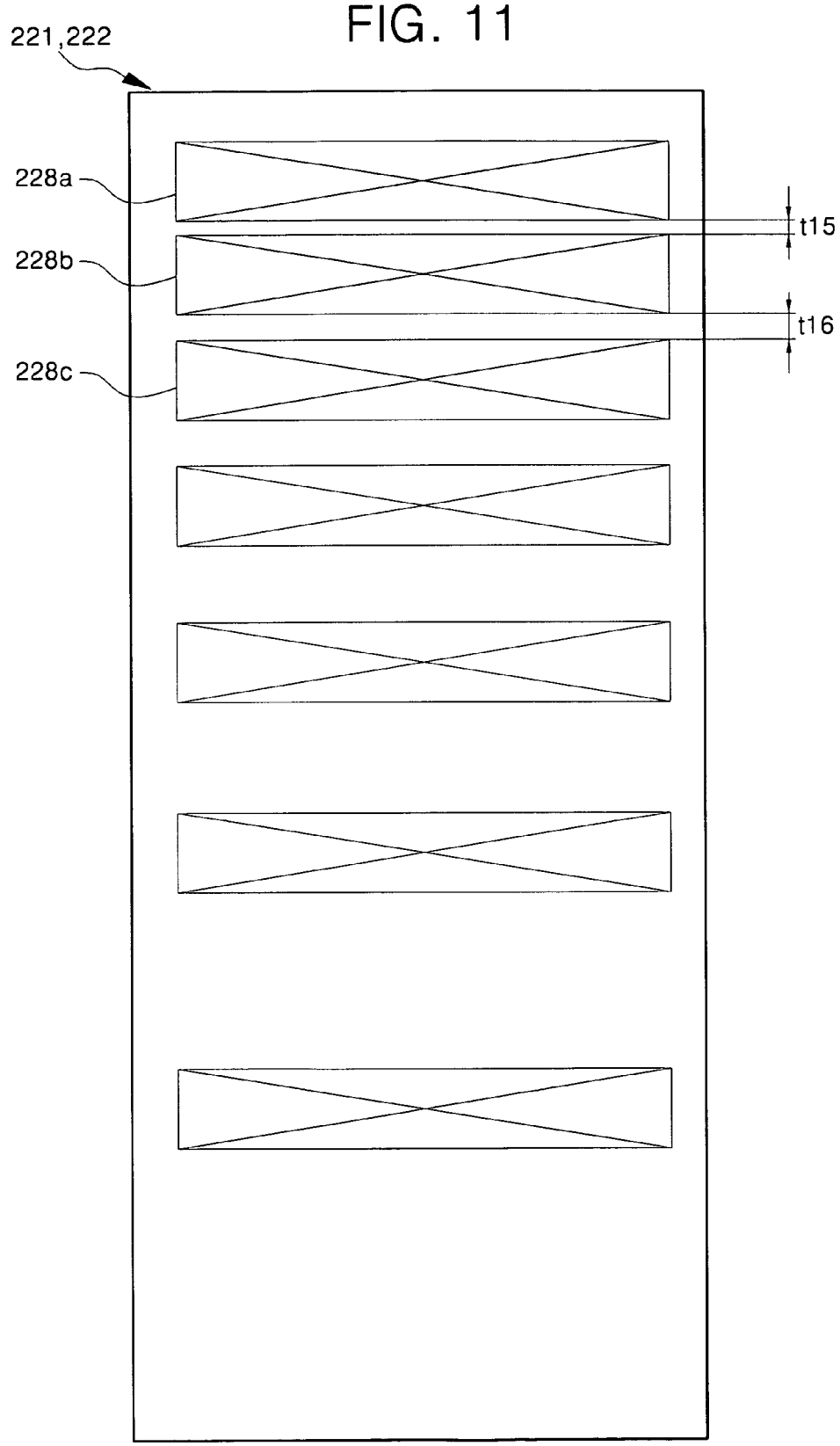
FIG. 11 is a plane figure of cathode power supply lines comprising a plurality of contact holes through which the cathode power supply lines are connected to cathode electrode in an organic electroluminescent display device according to a sixth preferred embodiment of the present invention.

As shown in FIG. 11, a plurality of contact holes 228a, 228b, and 228c may be asymmetrically arranged in a region overlapping cathode electrode 220 in the cathode power supply lines 221 and 222. The plurality of contact holes 228a, 228b, and 228c may be asymmetrically arranged with respect to an equipotential line in a long axial line of a region overlapping the cathode electrode in the cathode power supply lines 221 and 222. That is, the contact holes 228a, 228b, and 228c may be arranged such that distances between adjacent contact holes in a plurality of contact holes 228a, 228b, and 228c are different from each other. The contact holes may be at a distance from a part adjacent to an external terminal to which cathode voltage is supplied in a region overlapping the cathode electrode 220.

Three or more of the contact holes may be arranged in a row in a long axial direction of the cathode power supply lines 221 and 222. The contact holes may all be the same size. A distance t16 in a long axial direction of the cathode power supply lines 221 and 222 between contact holes 228b and 228c in a region having a small voltage drop may be shorter than a distance t15 in a long axial direction of the cathode power supply lines 221 and 222 between contact holes 228a, 228b adjacent to a region having a large voltage drop. The total circumference of a plurality of contact holes 228a, 228b, and 228c arranged in a region where the cathode electrode and cathode power supply lines overlap may be longer than the circumference of a superposition region of the cathode electrode and cathode power supply lines.

Therefore, voltage drop may be generated according to size of contact holes 228a, 228b, and 228c arranged because current density increases from a part having a small voltage drop to a part having a large voltage drop. Therefore, voltage distribution of the cathode power supply lines 221 and 222 may offset voltage drop of the power supply voltage lines 210 and 230 because the cathode power supply lines 221 and 222 may have voltage distribution directly opposite to voltage distribution of the power supply voltage lines 210 and 230.

Figure 12:
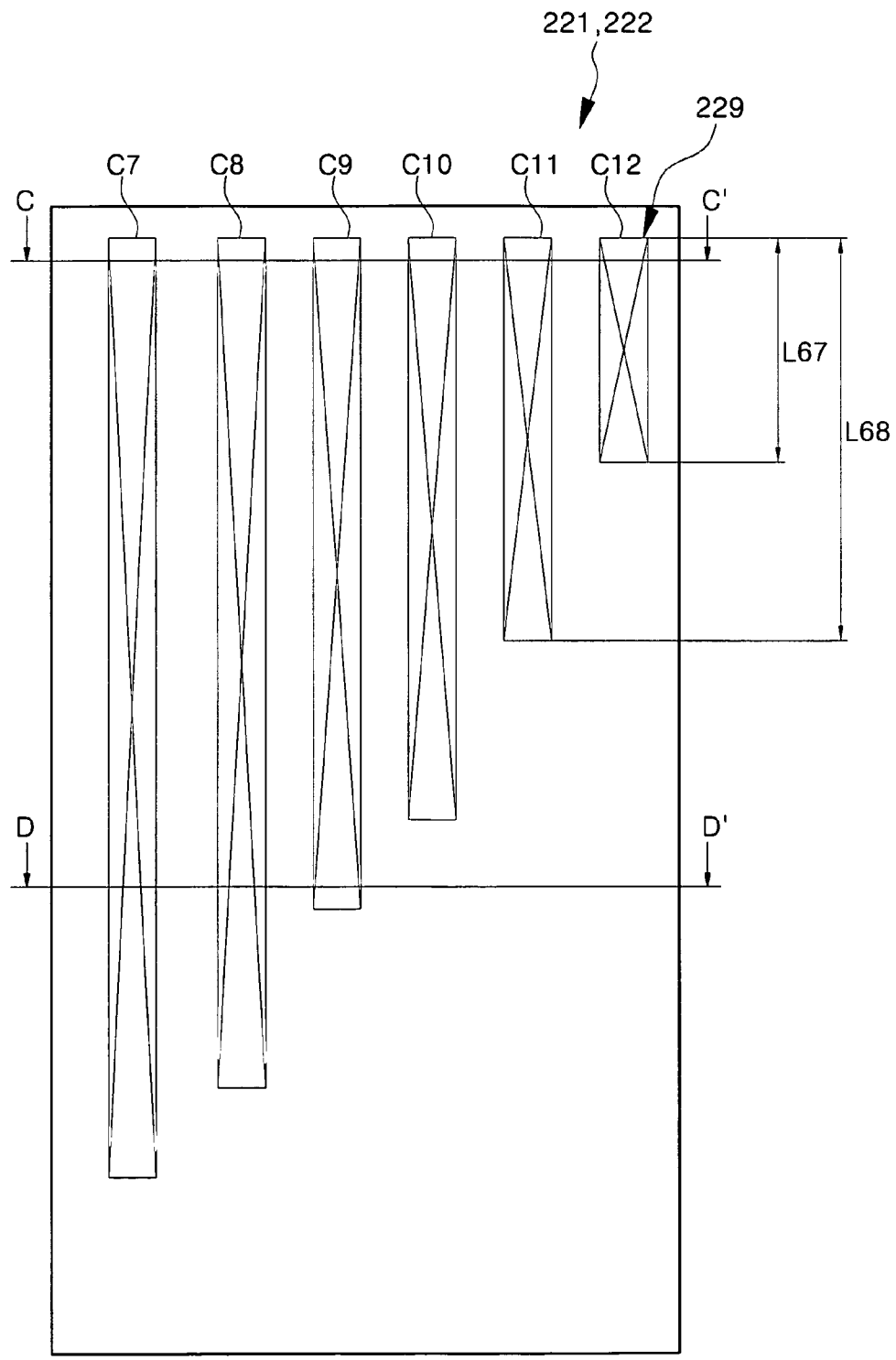
FIG. 12 is a plane figure of cathode power supply lines comprising a plurality of contact holes through which the cathode power supply lines are connected to cathode electrode in an organic electroluminescent display device according to a seventh preferred embodiment of the present invention.

As shown in FIG. 12, a plurality of contact holes 229 may be asymmetrically arranged in a region overlapping cathode electrode 220 in the cathode power supply lines 221 and 222. The plurality of contact holes 229 may be asymmetrically arranged with respect to an equipotential line in a long axial line of a region overlapping the cathode electrode in the cathode power supply lines 221 and 222.

Two or more of the contact holes 229 may be arranged in a short axial direction of the cathode power supply lines 221 and 222. The lengths of the contact holes 229 at least in a long axial direction may differ from each other. The sizes of the contact holes 229 and distances between adjacent contact holes in a short axial direction of the cathode power supply lines can be equal to or different from each other. The total circumference of a plurality of contact holes 229 arranged in a region where the cathode electrode and cathode power supply lines overlap may be longer than the circumference of a superposition region of the cathode electrode and cathode power supply lines.

The sum of lengths C7, C8, C9, C10, C11 and C12 of contact holes 229 of a CC' region having a large voltage drop may be larger than the sum of lengths C7, C8 and C9 of contact holes 229 of a DD' region having a small voltage drop. This may be because lengths of contact holes arranged in a long axial direction of the cathode power supply lines according to voltage drop of power supply voltage may differ from each other if the sizes of the contact holes arranged in each column in a short axial direction of cathode power supply lines are C7, C8, C9, C10, C11 and C12. Therefore, the total area of the contact holes 229 of the CC' region having a large voltage drop may also be larger than the total area of the contact holes 229 of the DD' region having a small voltage drop.

Therefore, voltage density of the cathode power supply lines 221 and 222 may offset voltage drop of the power supply voltage lines 210 and 230. This may be because the voltage density of the cathode power supply lines 221 and 222 has voltage distribution directly opposite to the voltage drop of the power supply voltage lines 210 and 230.

Although the cathode power supply lines may be formed at both sides of pixel region, and a plurality of contact holes may be asymmetrically arranged at the cathode power supply lines arranged at both sides of the pixel region, the cathode power supply lines may alternatively be formed at the pixel region as well as at least one side of the pixel region, and a plurality of the contact holes may be asymmetrically arranged the cathode power supply lines.

Asymmetrically arranging contact holes may cause voltage drops of cathode power supply lines offset voltage drop of power supply voltages. In addition, voltage drop of the power supply voltages can be compensated by varying the size and alignment states of the contact holes. These beneficial results may occur because current density at the cathode power supply lines is concentrated toward the perimeter of the contact holes.

The present invention may make the luminance of a pixel region uniform, particularly in an organic electroluminescent display. Additionally, the current provided may be controlled by arranging cathode power supply lines to counter voltage drop with voltage drop in the opposite direction. The voltage drop may be controlled by adjusting the distances between the contact holes. Power supply lines may include cathode power supply lines arranged on both sides of the pixel region. A plurality of contact holes may be asymmetrically formed at the cathode power supply voltage lines.

Although the invention has been particularly shown and described with reference to certain embodiments thereof, changes may be made without departing from the scope of the invention.

What is claimed is:

1. An organic electroluminescent display device, comprising:
    a pixel region on which are arranged a plurality of pixels, each comprising a first electrode and a second electrode and an organic thin film layer interposed between the first electrode and the second electrode;
    a first power supply line for supplying voltage of a first level to the plurality of pixels; and
    a second power supply line for supplying voltage of a second level to the second electrode, the second power supply line disposed in at least a superposition region superposed on the second electrode,
    wherein the second power supply line comprises a plurality of contact holes through which the second power supply line are connected to the second electrode, and the plurality of contact holes are asymmetrically arranged with respect to a bisector of the superposition region of the second power supply line and second electrode.

2. The organic electroluminescent display device of claim 1,
    wherein at least two or more of the contact holes are arranged in a direction of long axis of the second power supply line, and lengths of the contact holes differ from each other in the direction of the long axis of the second power supply line.

3. The organic electroluminescent display device of claim 2,
    wherein the contact holes in a region having high voltage drop are longer than the contact holes in a region having low voltage drop.

4. The organic electroluminescent display device of claim 2,
    wherein the contact holes in a region having high voltage drop are larger in area than the contact holes in a region having low voltage drop.

5. The organic electroluminescent display device of claim 1,
    wherein at least three or more of the contact holes are formed in a long axis direction of the second power supply line, and
    a first gap in the long axis direction between two adjacent contact holes in a region having high voltage drop differs from a second gap in the long axis direction between two adjacent contact holes in a region having low voltage drop.

6. The organic electroluminescent display device of claim 5,
    wherein the first gap is shorter than the second gap.

7. The organic electroluminescent display device of claim 1,
    wherein the lengths of the contact holes arranged in the long axis direction of the second power supply line differ from each other,
    at least two or more of the contact holes are formed in a short axis direction of the second power supply line, and
    the total length of the contact holes on the short axis direction in a region having high voltage drop is longer than the total length of the contact holes on the short axis direction in a region having low voltage drop.

8. The organic electroluminescent display device of claim 1,
    wherein the number of contact holes arranged in the short axis direction of the second power supply line in a region having high voltage drop differs from the number of contact holes arranged in the long axis direction of the second power supply line in a region having low voltage drop.

9. The organic electroluminescent display device of claim 8,
    wherein a gap between adjacent contact holes at a part having high voltage drop is equal to a gap between the adjacent contact holes at a part having low voltage drop.

10. The organic electroluminescent display device of claim 8,
    wherein a gap between adjacent contact holes at a part having high voltage drop differs from a gap between adjacent contact holes at a part having low voltage drop.

11. The organic electroluminescent display device of claim 10,
    wherein the gap between adjacent contact holes is less at the part having higher voltage drop than at the part having lower voltage drop.

12. The organic electroluminescent display device of claim 8,
    wherein all the contact holes are approximately equal in size.

13. The organic electroluminescent display device of claim 1, wherein the number of contact holes arranged in the short axis direction of the second power supply line in a region having high voltage drop is equal to the number of the contact holes arranged in the long axis direction of the second power supply line in a region having low voltage drop.

14. The organic electroluminescent display device of claim 13,
wherein a first gap between adjacent holes at a part having high voltage drop differs from a second gap between adjacent contact holes at a part having low voltage drop.

15. The organic electroluminescent display device of claim 14,
wherein the first gap is less than the second gap.

16. The organic electroluminescent display device according to claim 1,
wherein sizes of contact holes arranged in a long axis direction or short axis direction of the second power supply line differ from each other, and a plurality of the contact holes are arranged such that the total length of the contact holes decreases from a part having high voltage drop to a part having low voltage drop.

17. An organic electroluminescent display device, comprising:
a pixel region including an arrangement of a plurality of pixels comprising a first electrode and a second electrode and an organic thin film layer interposed between the first electrode and the second electrode;
a first power supply line for supplying voltage of a first level to the first electrode; and
a second power supply line for supplying voltage of a second level to the second electrode and comprising at least a region superposed on the second electrode,
wherein the second power supply line is arranged on at least two side surfaces of the pixel region,
wherein the second power supply line comprises a plurality of contact holes connecting the second power supply line to the second electrode, and
wherein the plurality of contact holes are asymmetrically arranged with respect to a bisector of the superposition region of the second power supply line and second electrode.

18. The organic electroluminescent display device of claim 17,
wherein at least two or more of the contact holes are arranged in a long axial direction of the second power supply line, and lengths of the contact holes differ from each other in the direction of the long axis of the second power supply line.

19. The organic electroluminescent display device of claim 17, wherein area of the contact holes in a region having high voltage drop is larger than the area of the contact holes in a region having low voltage drop.

20. The organic electroluminescent display device of claim 17, wherein at least three of the contact holes are formed in a long axis direction of the second power supply line, and a first gap between two adjacent of the at least three contact holes in a region having high voltage drop differs from a second gap between two adjacent of the at least three contact holes arranged in the long axis direction of the second power supply line in the region having low voltage drop.

21. The organic electroluminescent display device of claim 17, wherein the number of contact holes arranged in a short axis direction of the second power supply line differs from the number of contact holes arranged in the long axis direction of the second power supply line in regions having high and low voltage drops respectively.

22. The organic electroluminescent display device of claim 17, wherein the contact holes are arranged such that a first gap between adjacent holes at a part having high voltage drop differs from a second gap between the adjacent contact holes at a part having low voltage drop.

23. The organic electroluminescent display device of claim 22, wherein the first gap is less than the second gap.

24. The organic electroluminescent display device of claim 17, wherein numbers of contact holes arranged in each column are same.

25. The organic electroluminescent display device of claim 17, wherein sizes of contact holes arranged in each column and row are same.

26. The organic electroluminescent display device of claim 17, wherein sizes of contact holes arranged in each column and row differ from each other, and the total length of the contact holes is less in a part having low voltage drop than in a part having high voltage drop.

27. An organic electroluminescent display device, comprising:
a pixel region including a plurality of pixels comprising a first electrode and a second electrode and an organic thin film layer interposed between the first electrode and the second electrode;
a first power supply line for supplying voltage of a first level to the first electrode; and
a second power supply line for supplying voltage of a second level to the second electrode and comprising at least a superposition region superposed on the second electrode,
wherein the second power supply line is arranged on at least one side surface of the pixel region and has a plurality of contact holes, and
wherein the total circumference of the plurality of contact holes is greater than a circumference of the superposition region.

28. The organic electroluminescent display device of claim 27, wherein the plurality of contact holes are asymmetrically arranged with respect to a bisector of the superposition region.

29. The organic electroluminescent display device of claim 27, wherein at least two of the contact holes are arranged in a direction of long axis of the second power supply line, and lengths of the contact holes differ from each other in the direction of the long axis of the second power supply line.

30. The organic electroluminescent display device of claim 27, wherein area of the contact holes in a region having high voltage drop is larger than that of the contact holes in a region having low voltage drop.

31. The organic electroluminescent display device of claim 27, wherein at least three of the contact holes are formed in a long axis direction of the second power supply line, and a first gap between two adjacent of the three contact holes in a region having high voltage drop differs from a second gap between another two adjacent of the three contact holes in a region having low voltage drop.

32. The organic electroluminescent display device of claim 27, wherein number of contact holes arranged in the short axis direction of the second power supply line in a region having high voltage drop differs from number of contact holes arranged in the short axis direction of the second power supply line in regions having low voltage drop.

33. The organic electroluminescent display device of claim 27, wherein the contact holes are arranged such that a first gap between adjacent contact holes at a region having high voltage drop differs from a second gap between adjacent contact holes at a region having low voltage drop.

34. The organic electroluminescent display device of claim 33, wherein the first gap is less than the second gap.

35. The organic electroluminescent display device of claim 34, wherein numbers of the contact holes arranged in each column are same.

36. The organic electroluminescent display device of claim 27, wherein each of the contact holes arranged in each column and row are uniformly sized.

37. The organic electroluminescent display device of claim 29, wherein sizes of contact holes arranged in each column and row differ from each other, and the total length of the contact holes in a part having high voltage drop is longer than in a part having low voltage drop.

* * * * *